United States Patent [19]
Bailey

[11] Patent Number: 5,327,076
[45] Date of Patent: Jul. 5, 1994

[54] GLITCHLESS TEST SIGNAL GENERATOR

[75] Inventor: Philip A. Bailey, Lino Lakes, Minn.

[73] Assignee: Micro Control Company, Minneapolis, Minn.

[21] Appl. No.: 946,544

[22] Filed: Sep. 17, 1992

[51] Int. Cl.[5] ............................................. G01R 31/28
[52] U.S. Cl. ..................................... 324/158.1; 371/27
[58] Field of Search ...................... 324/158 R; 371/27; 73/861.17; 328/151

[56] References Cited

U.S. PATENT DOCUMENTS

| | | | |
|---|---|---|---|
| 2,808,723 | 10/1957 | Buntenbach | 73/861.17 |
| 3,329,018 | 4/1967 | Hognestad | 73/861.17 |
| 3,783,687 | 1/1974 | Mannherz et al. | 73/861.17 |
| 4,701,918 | 10/1987 | Nakajima et al. | 371/20 |
| 4,821,238 | 4/1989 | Tatematsu | 365/201 |
| 4,849,973 | 7/1989 | Kubota | 371/21 |
| 5,057,771 | 10/1991 | Pepper | 324/158 R |

Primary Examiner—Ernest F. Karlsen
Attorney, Agent, or Firm—Westman, Champlin & Kelly

[57] ABSTRACT

A test signal generating system for providing test signals to electronic circuit components under test in a burn-in system, the test signal generating system having a timing arrangement for eliminating glitches from the test signals, The test signal generating system comprises a data generator, a timing generator and a format selector, each of which provides an input signal to a test signal selector, A first, second and third flip-flop are electrically connected to the data generator, timing generator and format selector, respectively. A fourth flip-flop is electrically connected to an output of the test signal selection means, Each of the flip-flops is triggered by the same clock.

6 Claims, 1 Drawing Sheet

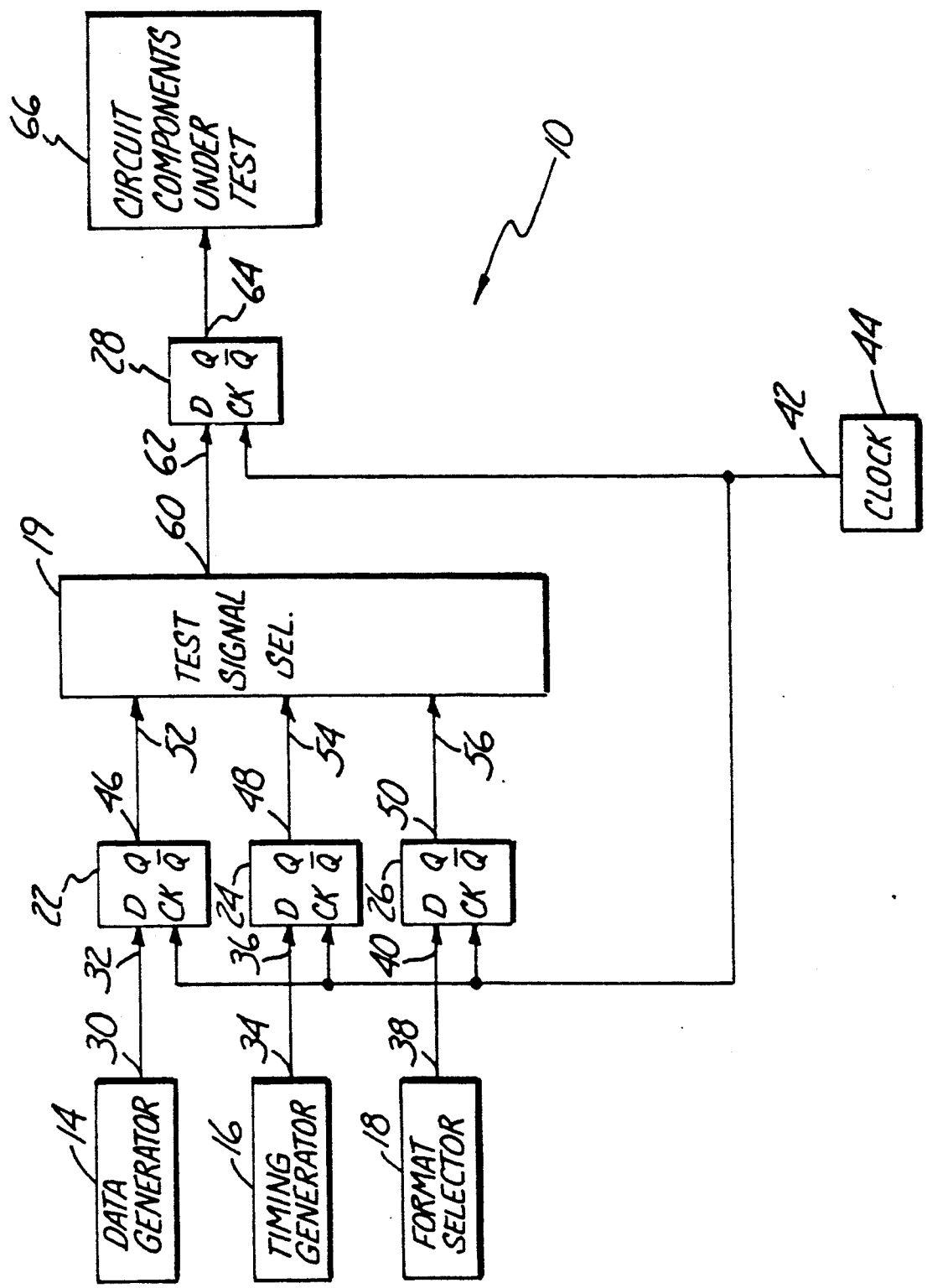

GLITCHLESS TEST SIGNAL GENERATOR

BACKGROUND OF THE INVENTION

The present invention relates to the provision of test signals to electronic circuit components in a burn-in system and, in particular, to a system for generating test signals which contains a timing arrangement that eliminates any glitches in the test signals sent to electronic circuit components.

In a burn-in system, it is necessary to be able to selectably provide a variety of test signals in various sequences to the electronic circuit components under test. A problem with providing such test signals occurs when the input signals from which the test signal is chosen do not change state at exactly the same time. When this occurs, a momentary selection of the previous value of one of the input signals may occur. Such an inaccurate selection can manifest itself in the form of a glitch in the test signal. Such a glitch can adversely affect the operation of the electronic circuit components under test.

In some burn-in systems, glitches in the test signal are ignored. This can result in parts of the electronic circuit components being falsely triggered, interfering with their operation. In other burn-in systems, glitches in the test signal are minimized by limiting the order and variety of the test signals used so that a glitch will not appear. However, this solution limits the versatility of the burn-in system.

There is therefore the need for a system for generating test signals that is capable of providing a glitchless test signal to the electronic circuit components under test.

SUMMARY OF THE INVENTION

The present invention relates to a system for providing glitchless test signals to electronic circuit components under test in a burn-in system. The system comprises a data generator, a timing generator and a format selector providing signals to a test signal selector. The data generator, timing generator, format selector and test signal selector each have a flip-flop electrically connected to its output.

The data generator, timing generator and format selector send signals through first, second and third flip-flops, respectively. Each of the first, second and third flip-flops, when triggered by a clock, sample the signals provided by the data generator, timing generator and format selector, respectively. The value of the signal when sampled is sent to the test signal selector which then selects a test signal based on the signals it receives.

The test signal selected by the test signal selector is provided at an output which is electrically connected to a fourth flip-flop. The fourth flip-flop, which is triggered by the same clock as the other flipflops, will sample the test signal and provide the value of the sampled signal to the electronic circuit components under test.

BRIEF DESCRIPTION OF THE DRAWING

The sole figure is a block diagram of the test signal generating system in accordance with the present invention.

DETAILED DESCRIPTION OF THE PREFERRED EMBODIMENT

The test signal generating system 10 of the present invention, shown in the figure, comprises a data generator 14, a programmable timing generator 16 and a format selector 18, each of which provides an input signal to a test signal selector 19. The system 10 also contains a first flip-flop 22, a second flip-flop 24, a third flip-flop 26 and a fourth flip-flop 28.

An output 30 of the data generator 14 is electrically connected to a first input 32 of the first flip-flop 22, an output 34 of the timing generator 16 is electrically connected to a first input 36 of the second flip flop 24 and an output 38 of the format selector 18 is electrically connected to a first input 40 of the third flip-flop 26. An output 42 of a clock 44 is electrically connected to the clock inputs of each of the first, second and third flip-flops 22,24,26. An output 46 of the first flip-flop 22, an output 48 of the second flip-flop 24 and an output 50 of the third flip-flop 26 are electrically connected to a first input 52, a second input 54 and a third input 56 of the test signal selector 19, respectively.

The test signal selector 19 comprises logic circuitry which determines the value of a test signal to be provided at an output 60 based on the values of input signals at the first input 52, second input 54 and third input 56. The output 60 is electrically connected to a first input 62 of the fourth flip-flop 28 while the clock input of the fourth flip-flop 28 is electrically connected to the output 42 of the clock 44. An output 64 of the fourth flip-flop 28, which is the output of the test signal generating system 10, is electrically connected to a plurality of electronic circuit components 66.

The data generator 14 provides a data signal at its output 30 and the timing generator 16 provides a timing signal at its output 34. These signals are provided to the test signal selector 19, which then provides a test signal at its output 60. The test signal selector 19 can provide the data signal, the timing signal or any combination of the two signals as a test signal. A format select signal provided from the output 38 of the format selector 18 instructs the test signal selector 19 which combination of the data and timing signals to provide as the test signal at the output 60.

The clock 44, which operates at a frequency of 100 megahertz (MHz), triggers each of the first, second, third and fourth flip-flops 22,24,26,28. Each flip-flop is a delay flip-flop and is triggered every ten nanoseconds by the rising edge of a clock pulse from the clock 44.

In operation, the first flip-flop 22 is triggered on a rising edge of a clock pulse from the clock 44 and, when triggered, samples the data signal at its first input 32. The first flip-flop 22 provides the sampled value of the data signal at its output 46 for the duration of the clock pulse. The second flip-flop 24 is triggered on the rising edge of the same clock pulse as the first flip-flop 22 and, when triggered, samples the timing signal at its first input 36. The second flip-flop 24 provides the sampled value of the timing signal at its output 48 for the duration of the clock pulse. The third flip-flop 26 is also triggered on the rising edge of the same clock pulse as the first flip-flop 22 and, when triggered, samples the format select signal at its first input 40. The third flip-flop 26 provides the sampled value of the format select signal at its output 50 for the duration of the clock pulse.

The sampled data signal, timing signal and format select signal are applied to the first, second and third inputs 52,54,56 of the test signal selector 19, respectively. Based on the values of these signals, the test signal selector 19 provides a test signal at its output 60. Upon the provision of the following clock pulse from the clock 44, the fourth flip-flop 28, which is triggered on the rising edge of the clock pulse, samples the test signal provided at its first input 62. The fourth flip-flop 28 provides the sampled value of the test signal at its output 64 for the duration of the clock pulse.

With each clock pulse from the clock 44, the first, second and third flip-flops 22,24,26 will sample the data, timing and format select signals, respectively. The test signal selector 19, based on the sampled values of these signals, provides a test signal at its output 60. Also with each clock pulse, the fourth flip-flop 28 provides a sampled value of the test signal at its output 64 and holds it for the duration of the clock pulse.

Clock skew between the first, second and third flip-flops 22,24,26 may cause the samples of the data, timing and format select signals to be taken at slightly different times, resulting in the momentary selection of the previous value of one of the signals by the test signal selector 19. This can cause a glitch to appear in the test signal provided at the output 60 of the test signal selector 19. However, the fourth flip-flop 28 samples the test signal only once every ten nanoseconds, while the glitch lasts for a much shorter period of time. The glitch will therefore not be sampled by the fourth flip-flop 28 when it is triggered by the rising edge of a clock pulse.

A potential problem will exist if the fourth flip-flop 28 is triggered at the same time that a glitch appears at its first input 62. This is avoided however, by sending the data, timing and format select signals through the first, second and third flip-flops 22,24,26, respectively, and triggering each of the flip-flops 22,24,26,28 off of the same clock 44. This causes any change in the data, timing and format select signals to occur on the rising edge of each clock pulse at ten nanosecond intervals. Any glitch that develops at the output 60 of the test signal selector 19 will therefore occur just after the rising edge of each clock pulse triggers the fourth flip-flop 28 to sample the test signal and will no longer be at the first input 62 when the fourth flip-flop 28 next samples the test signal. In this way, any transition in the test signal is cleanly provided at the output of the fourth flip-flop 28 and is sent to the electronic circuit components 66 under test without a glitch.

The clock 44, although described as operating at 100 MHz, can operate at both higher and lower frequencies. However, the frequency selected will affect the resolution of the test signal provided at the output 64 of the system 10. The lower the frequency of the clock 44 the less resolution available to position the test signal. The system 10 of the present invention, although described as having data, timing and format select signals, can have any number of signals provided to the test signal selector 19 from which the test signal is selected.

The test signal provided at the output 64 of the fourth flip-flop 28, while described as being provided to the electronic circuit components under test, can be provided to a programmable driver circuit. The programmable driver circuit converts the standard TTL voltage levels to a higher or a lower level as desired before providing the test signal to the electronic circuit components 66.

Although the present invention has been described with reference to preferred embodiments, workers skilled in the art will recognize that changes may be made in form and detail without departing from the spirit and scope of the invention.

What is claimed is:

1. A test signal generating system for generating glitchless test signals to be provided to an electronic circuit component under test in a burn-in system, the test signal generating system comprising:
   a data generator providing a data signal;
   a timing generator providing a cycle clock signal;
   a format selector providing a format signal;
   a trigger clock providing a trigger clock signal formed of pulses and having trigger clock period;
   first storage means, connected to the data generator, the timing generator, the format selector and the trigger clock, for storing as stored signals the present states of the data signal, the cycle clock signal and the format signal upon receipt of one of the pulses in the trigger clock signal;
   test signal selection means, coupled to the first storage means, for receiving the stored signals and providing a test signal based on the stored signals;
   second storage means, coupled to the test signal selection means and the trigger clock, for storing as a stored test signal a present state of the test signal upon receipt of a pulse in the trigger clock signal; and
   wherein the second storage means provides the stored test signal until a subsequent pulse in the trigger clock signal such that glitches in the test signal caused by skew in timing of providing the stored signals to the test signal selection means are not passed to the electronic circuit component under test.

2. The system of claim 1 wherein the test signal selection means includes logical circuit means for providing the test signal as a logical function of the data signal and the cycle clock signal, the logical function being determined by the format signal.

3. The system of claim 2 wherein the first storage means comprises a first flip-flop electrically connected to an output of the data generator and a first input of the test signal selection means, a second flip-flop electrically connected to an output of the timing generator and a second input of the test signal selection means, and a third flip-flop electrically connected to an output of the format selector and a third input of the test signal selection means, and wherein the second storage means comprises a fourth flip-flop electrically connected to the output of the test signal selection means.

4. The apparatus of claim 3 wherein the first, second, third and fourth flip-flops are delay flip-flops connected to the trigger clock, triggered to store states of signals upon receiving an edge of a pulse in the trigger clock signal.

5. The apparatus of claim 4 wherein the trigger clock operates at a frequency of one hundred megahertz.

6. The apparatus of claim 2 wherein the logical circuit means comprises logic circuit having a signal delay less than the trigger clock period such that glitches in the test signal dissipate before the test signal is stored in the fourth storage means.

* * * * *